United States Patent [19]
Glahn et al.

[11] Patent Number: 5,434,358
[45] Date of Patent: Jul. 18, 1995

[54] HIGH DENSITY HERMETIC ELECTRICAL FEEDTHROUGHS

[75] Inventors: Timothy J. Glahn, Kensington, Md.; Mark J. Montesano, Fairfax, Va.

[73] Assignee: E-Systems, Inc., Dallas, Tex.

[21] Appl. No.: 166,299

[22] Filed: Dec. 13, 1993

[51] Int. Cl.⁶ .............................................. H01L 23/02
[52] U.S. Cl. .................................. 174/52.4; 257/693; 257/699
[58] Field of Search ............... 174/52.4, 52.1, 52.2, 174/52.3, 52.5, 154, 155, 156, 157; 29/827; 437/209, 211, 218, 221; 439/408, 591; 257/669, 678, 693, 698, 699, 700–703, 705, 708, 729

[56] References Cited

U.S. PATENT DOCUMENTS

| | | | |
|---|---|---|---|
| 3,320,351 | 5/1967 | Glickman | 174/52.4 |
| 4,412,093 | 10/1983 | Wildeboer | 174/52.4 |
| 4,506,108 | 3/1985 | Kersch et al. | 174/52.4 |
| 4,519,659 | 5/1985 | Shiino et al. | 439/591 |
| 4,520,562 | 6/1985 | Sado et al. | 29/878 |
| 4,524,238 | 6/1985 | Butt | 174/52.4 |
| 4,547,624 | 10/1985 | Tower et al. | 29/588 X |
| 4,672,151 | 6/1987 | Yamamura | 174/52.4 |
| 4,704,626 | 11/1987 | Mahuliuar et al. | 257/729 |
| 4,882,212 | 11/1989 | SinghDeo et al. | 428/76 |
| 5,001,299 | 3/1991 | Hingorany | 174/52.4 |
| 5,109,594 | 5/1992 | Sharp et al. | 29/600 |
| 5,138,114 | 8/1992 | Breit et al. | 174/52.4 |
| 5,221,860 | 6/1993 | Dietrich et al. | 257/678 |
| 5,223,741 | 6/1993 | Bechtel et al. | 257/678 |
| 5,247,134 | 9/1993 | Beltz | 174/52.4 |
| 5,315,486 | 5/1994 | Fillion et al. | 361/795 |

FOREIGN PATENT DOCUMENTS

| | | | |
|---|---|---|---|
| 0152154 | 9/1982 | Japan | 437/221 |
| 0268156 | 10/1989 | Japan | 437/215 |

*Primary Examiner*—Leo P. Picard
*Assistant Examiner*—Christopher Horgan
*Attorney, Agent, or Firm*—Rogers & Killeen

[57] ABSTRACT

A ceramic feedthrough for a package for an electronic device provides a plurality of electrical connections through an opening in the package. A method of making the feedthrough and of packaging the electronic device includes electrically conductive paths that are formed from a metal paste applied between green sheets that are joined and cofired to form a ceramic body. Vias extend from an exterior surface of the ceramic body to the paths to complete the electrical connection from outside the package to inside the package. A density of 50 paths per inch or greater may be achieved. The ceramic body may be hermetically sealed into an opening in the package and the body may have a peripheral extension to facilitate attachment of the feedthrough to the package.

26 Claims, 3 Drawing Sheets

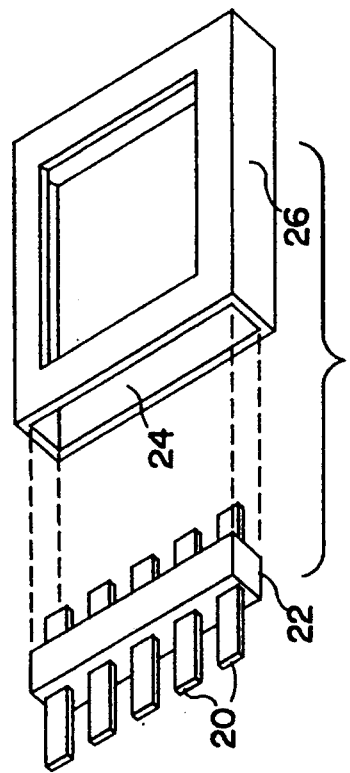
FIG. 2 (PRIOR ART)
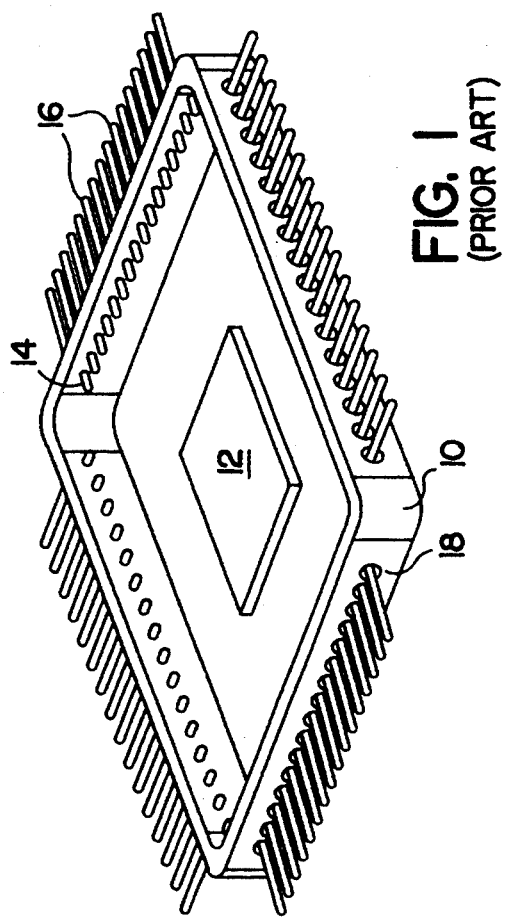
FIG. 1 (PRIOR ART)
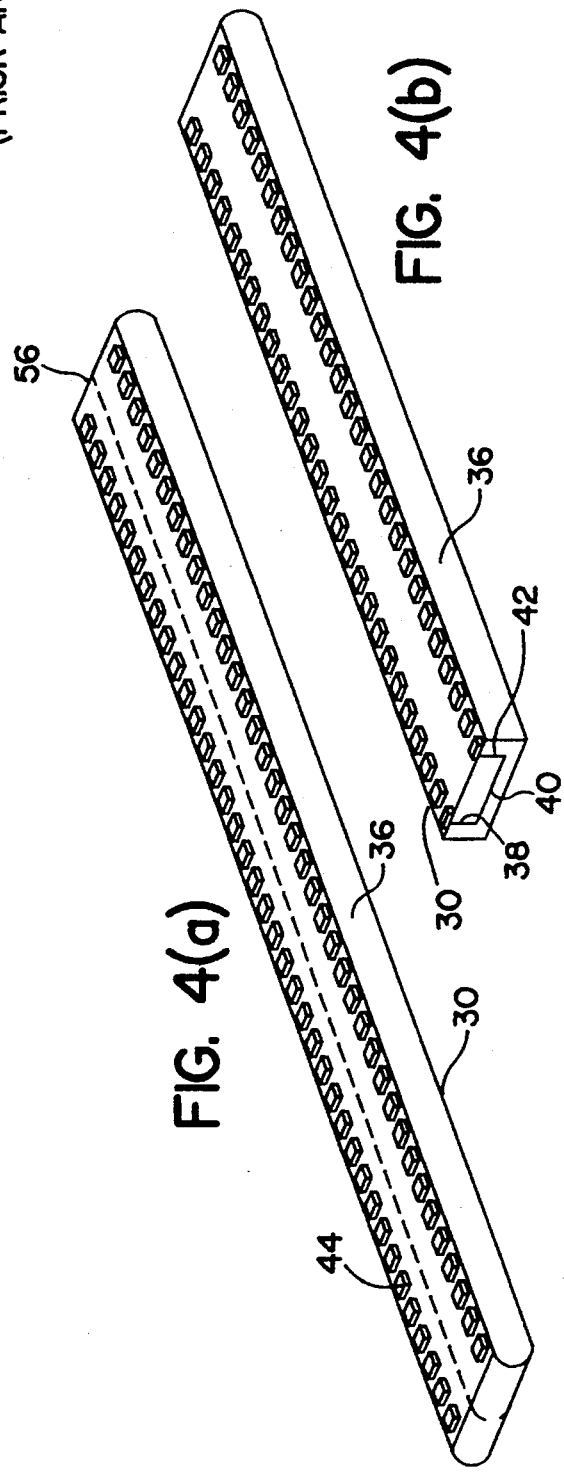
FIG. 4(b)
FIG. 4(a)

HIGH DENSITY HERMETIC ELECTRICAL FEEDTHROUGHS

BACKGROUND OF THE INVENTION

The present invention relates to packaging for electronic devices, and more particularly to methods and devices for hermetically sealing packages for electronic chips and circuits that have a plurality of electrical connections.

Electronic devices, and particularly chips, circuits, microcircuits and the like, may operate in environments hostile to reliable device operation. In such environments, it is desirable to place one or more of the devices in a package that is sealed from contaminants such as dust, humidity, air, oxygen and the like. When a package is sealed to protect the device therein from one or more of the contaminants that affect device operation, the package is said to be hermetically sealed.

While various types of packaging materials are known, metal matrix composites are particularly favored because they are engineered materials that may be tailored to have specific properties. For example, compared to ceramic packaging materials, metal matrix composites have about a 30% lower mass density, are stiffer and less brittle, and have a significantly higher thermal conductivity. A ceramic package that has a coefficient of thermal expansion (CTE) matched to the CTE of the substrate of the electronic device therein-side may have a relatively poor thermal conductivity of about 21 W/m°K., while a silicon carbide/aluminum metal matrix composite with a similarly matched CTE would have a thermal conductivity of about 180 W/m°K. Other materials, such as Kovar or molybdenum, may be favored as packaging materials when the amount of packaging material is large and cost is critical, and/or when power dissipation is nominal.

Matching the CTE of the packaging material to the CTE of the portion of the electronic device in contact with the package (e.g., a silicon chip or a substrate connecting several chips) is a widely used technique in the electronics industry. However, as illustrated in the example above, ceramic packages with matched CTEs have a relatively low thermal conductivity and may be unsuitable for electronic devices with high power requirements. Metal matrix composites with matched CTEs are more likely to be able to provide adequate thermal conductivity so that heat generated by the electronic device can be conducted to an exterior heat sink and keep the device within an acceptable operating temperature range.

One of the problems associated with metal matrix composite packages is that they are electrically conductive and the electronic devices inside the package may have a multiplicity (e.g., hundreds) of electrical connections that must be made through the packaging material. If the packaging material is conductive or semi-conductive, each electrical connection through the package must be insulated from the packaging material to prevent electrical shorts to the package. This problem is exacerbated where the package is to be hermetically sealed because each passageway through the package for an electrical connection (i.e., a feedthrough) must also be hermetically sealed.

With reference to FIG. 1, one known technique for insulating the electrical connections through a package 10 for an electronic device 12 is to provide separate feedthroughs 14 for each electrical connection 16. (See, for example, U.S. Pat. No. 4,506,108 issued Mar. 19, 1985 to Kersch, et al.) The feedthroughs 14 may be electrically insulated from the package 10 by insulative material 18, such as glass beads, which surround the feedthrough, supporting and insulating it, as it penetrates the package. As is apparent, however, the number of electrical connections that can be made is limited because the distance between feedthroughs must be sufficient for the insulative material 18 surrounding adjacent feedthroughs 14. For example, the minimum center to center spacing achievable using this technique with glass beads is only about 0.050 inches, yielding a density of about 20 electrical connections per inch. When hundreds of electrical connections are to be made, the size of the package must be increased and such large packages are not favored in many applications, particularly in light of the increasing demand for miniature integrated circuit packages. In addition, the insulative material such as glass may crack during lead formation and/or shock experienced by the package.

Packages with multiple connections per feedthrough (instead of just one connection per feedthrough) are also known. (See, for example, U.S. Pat. No. 4,412,093 issued Oct. 25, 1983 to Wildeboer). With reference to FIG. 2, prior art feedthroughs include plural electrical connectors 20 that extend all the way through a single glass insulator 22. The feedthrough is thereafter inserted into an opening 24 in the frame 26 for the package and a glass-to-metal seal formed to seal the end of the package. An electronic device may be thereafter placed in the frame 26, electrical connections made, and a lid installed to hermetically seal the device.

However, the connectors 20 must have sufficient structure to be self-supporting so they rigidly extend from both sides of the glass insulator 22 and large enough to be joined to an exterior component (e.g., by solder, weld, bonding, etc.), requirements that are likely to be met only by the board-like electrical connectors 20 illustrated in FIG. 2 or the large diameter wires of FIG. 1. Additionally, the connections must be spaced sufficiently to permit the glass to flow between adjacent connectors to form a self-supporting structure. While electrical connection density may be increased somewhat, the size restrictions imposed by the rigidity, connection, and flow requirements still reduce the number of connectors that may be carried by a single feedthrough below that needed for some applications. The device is also susceptible to some of the other problems associated with the single connector feedthroughs, such as cracking of the glass insulator 22.

Accordingly, it is an object of the present invention to provide a novel feedthrough having multiple electrical connections that obviates these and other problems of the prior art.

It is another object of the present invention to provide a novel method for packaging an electronic device that obviates the problems of the prior art.

It is a further object of the present invention to provide a novel feedthrough having multiple electrical connections through a multilayer cofired ceramic structure.

It is still a further object of the present invention to provide a novel packaging and device having multiple electrical connections that extend from inside a package to outside the package and that are small enough to significantly increase the number of such connections that can be accommodated without increasing package size.

It is yet a further object of the present invention to provide a novel method of making a feedthrough having multiple electrical connections by connecting vias to electrically conductive metal paste paths that are between two or more ceramic green sheets.

It is still another object of the present invention to provide a novel method of hermetically sealing a package for an electronic device in which a feedthrough having multiple electrical connections is formed by connecting vias to electrically conductive paths that are between two or more ceramic layers and is inserted into an opening in the package frame and hermetically sealed therein.

These and many other objects and advantages of the present invention will be readily apparent to one skilled in the art to which the invention pertains from a perusal of the claims, the appended drawings, and the following detailed description of preferred embodiments.

BRIEF DESCRIPTION OF THE DRAWINGS

FIG. 1 is a pictorial representation of a prior art package having plural feedthroughs, each with one electrical connector therethrough.

FIG. 2 is a pictorial representation of a prior art package having a feedthrough with plural electrical connections therethrough.

FIGS. 4a and 4b are pictorial representation of (a) an embodiment of the feedthrough of the present invention, and (b) a cut-away illustration of the interior thereof.

DESCRIPTION OF PREFERRED EMBODIMENTS

Figure 3:
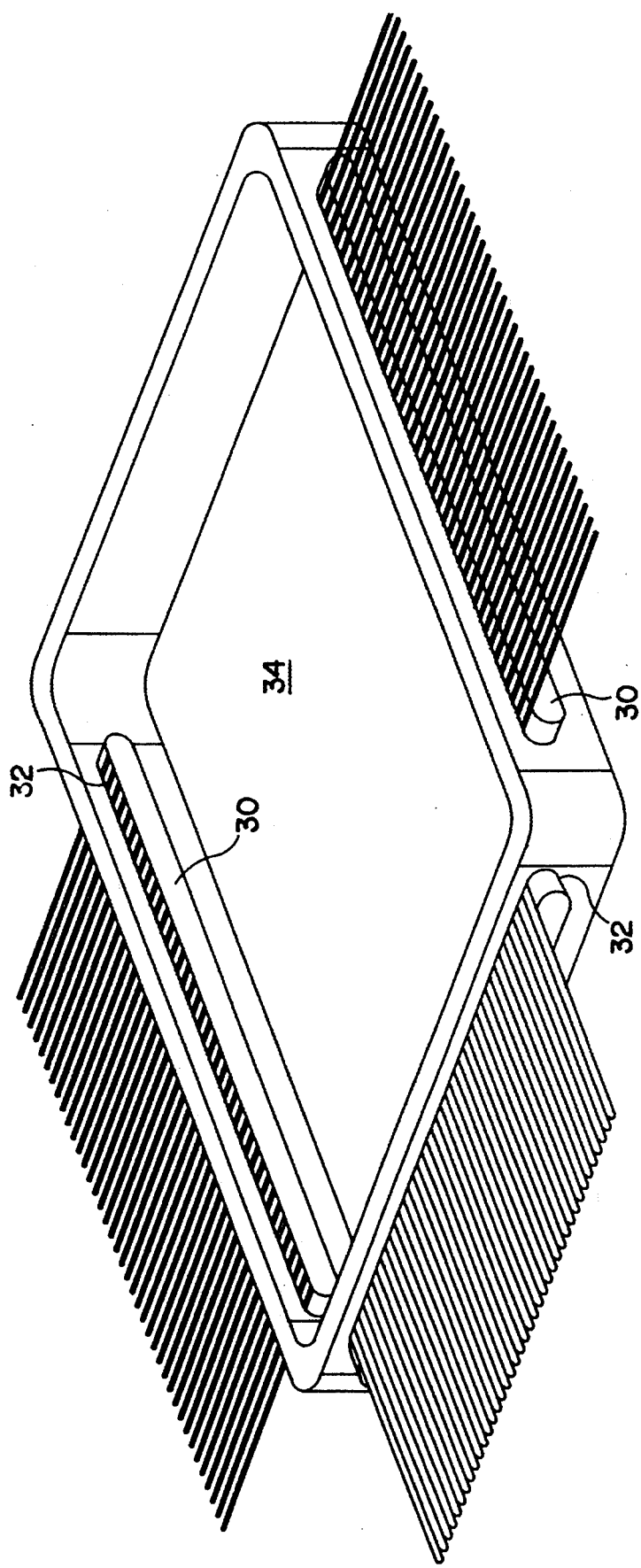
FIG. 3 is a pictorial representation of an embodiment of the present invention.

With reference now to FIGS. 3 and 4, the present invention may include a feedthrough 30 that may be inserted into an opening 32 in a package frame 34 for an electronic device (not shown). The frame may be constructed from conventional packaging materials, such as metal matrix composite, Kovar, molybdenum, explosively bonded metals, ceramic, and the like. As will be discussed in more detail below, the feedthrough 30 may have a multilayer ceramic structure 36 with a plurality of electrical connections 38 therethrough. Each connection 38 may have a path 40 internal to the multilayer ceramic structure 36 connected to vias 42 that extend from a surface of the ceramic 36 structure into contact with the path 40, each path 40 being contacted by a via 42 adjacent each end so as to form an electrical connection from one via 42, through a connected path 40, to another via 42. When the feedthrough 30 is inserted into the opening 32, a via 42 at one end of each connection 38 is inside the frame 34 and the via 42 at the other end of the connection 38 is outside the frame 34. Each via 42 may have corresponding contact pads 44 for making electrical connections between the electronic device and the circuitry, power sources, etc., inside and/or outside the package.

Figure 5:
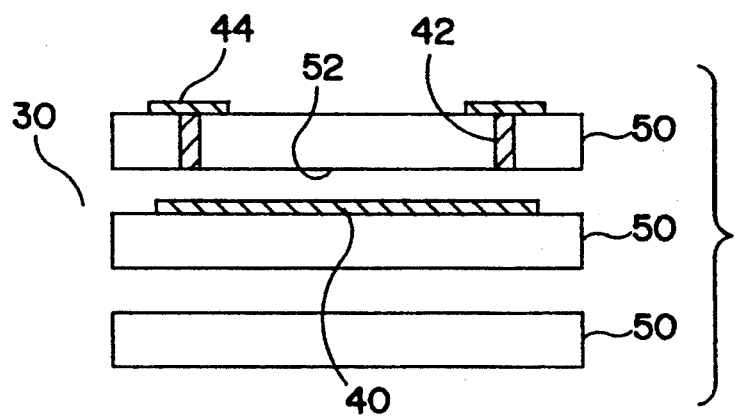
FIG. 5 is an exploded vertical cross-section of an embodiment of the feedthrough of the present invention.

With reference now to FIG. 5, the feedthrough 30 may include two or more ceramic layers 50 joined to form a structure that substantially closes the opening 32 in the frame 34 when inserted thereinto. Each of the layers 50 may have a CTE compatible with the CTE of the frame 34 so that heat from the electronic device or elsewhere that may cause expansion of the frame 34 and layers 50 does not impair a seal between the frame 34 and the layers 50. Desireably, the CTEs of the layers and frame are within about 20% of each other over the normal operating ranges of the device. Two of the layers 50 join at a plane 52 that extends through the opening 32 in the frame 34 when the feedthrough 30 is inserted into the opening. The feedthrough 30 includes a plurality of electrically conductive paths 40 that extend across the plane 52 from outside to inside the frame 34 when the feedthrough 30 is inserted into the opening 32. Each of the paths 40 is connected to the exterior surface of the feedthrough 30 by electrically conductive vias 42 that extend from an exterior surface of the feedthrough 30 to the plane 52. Each of the vias 42 contacts one of the paths 40 adjacent an end thereof so that each of the paths 40 has one of the vias 42 at each end to form a U-shaped electrical connection from one via 42, through a path 40, to another via 42. Contact pads 44 may also be provided.

The layers 50 may be any conventional ceramic or low temperature cofired ceramic, such as alumina, aluminum nitride, beryllium oxide, silicon dioxide, etc., that has a CTE compatible with the CTE of the material of the frame 34. For example, alumina is compatible with a silicon carbide/aluminum metal matrix composite and with Kovar, and aluminum nitride is compatible with molybdenum. The layers 50 may be formed using conventional "green sheet" techniques. In general, such techniques start with a ceramic slurry formed by mixing a ceramic particulate, a thermoplastic polymer and solvents. This slurry is spread into ceramic sheets of predetermined thickness, typically about 0.006 inch, from which the solvents are volitized, leaving self-supporting flexible green sheets. Once the paths 40 have been applied (see discussion below) and the appropriate number of green sheets stacked (the number of sheets depending on the size of the opening 32), the stack of green sheets may be fired to drive off the resin and sinter the particulate together into a multilayer ceramic of higher density than the green sheets. The green sheets shrink when fired, with a 0.006 inch thick green sheet typically forming a layer 50 about 0.005 inch thick.

The paths 40 are applied to the green sheets before the layers 50 are joined for firing. The paths 40 may comprise an electrical conductor, such as copper, aluminum, or a refractory metal paste, that may be deposited on the green sheets (i.e., in plane 52) using conventional techniques. For example, the paths 40 may be deposited, sprayed, screened, dipped, plated, etc. onto the green sheets in generally parallel rows that extend substantially from one side of the sheets to the other. The paths 40 may have a center to center spacing as small as about 0.020 inch (smaller spacing may be achieveable as path forming technology advances) so that a path density of up to 50 or more paths per inch may be achieved.

The paths 40 may be formed on multiple layers with vias selectively connecting the paths at desired locations. If desired, portions of the paths can run parallel to the longitudinal sides of the feedthrough 30 forming small circuits therein.

Figure 6:
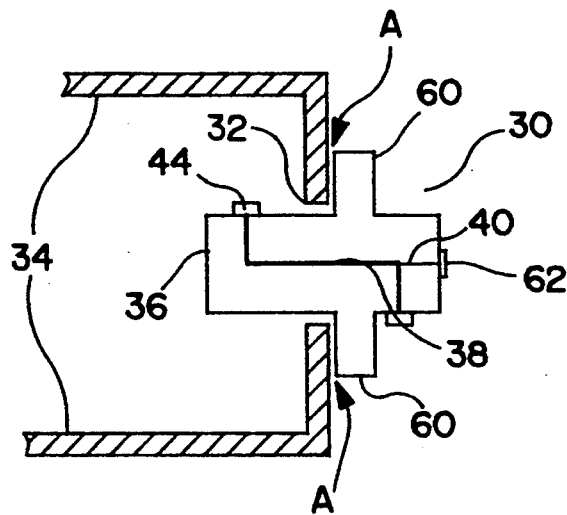
FIG. 6 is a partial vertical cross-section of an alternative embodiment of the feedthrough of the present invention illustrating the extensions for attaching the feedthrough to a frame.

After the paths 40 have been applied to the green sheets and after the green sheets have been joined, the vias 42 may be formed and filled. The vias 42 may be formed using any conventional technique, such as drilling, punching, laser cutting, etc. The vias 42 may have a size appropriate for the path spacing, with about a 0.004 inch diameter hole being appropriate for 0.020 inch center to center path spacing. The vias may extend from an exterior surface of one of the layers 50 to the paths 40 or from one layer of paths 40 to another (not shown). In one embodiment, the vias 42 all extend inwardly from the same exterior surface to form U-shaped connections 38 (such as illustrated in FIG. 4), although the vias 42 may extend inwardly from opposing exterior surfaces to form L-shaped connections 38 (such as illustrated in FIG. 6) or may extend inwardly from alternate exterior surfaces so that U-shaped connections open both up and down in the same feedthrough (not shown) or in any desired configuration. After being formed and before firing, the vias 42 reaching the exterior surface are filled with an electrical conductor, preferably a refractory metal, such as tungsten or molybdenum. The contact pads 44 may be conventional electrically conductive materials, such as alumium or copper, or may be screened on top of the vias 42 before firing using a metal paste, that may be thereafter plated. The feedthroughs 30 may be fired using conventional techniques, with low temperature cofired ceramic techniques being recommended when copper or aluminum are used.

After being fired, the feedthrough 30 may be inserted into the opening 32 in the frame 34 and sealed. The seal may be formed using conventional techniques. For example, after firing the feedthrough 30 may be plated so that it can be connected to the frame 34, such as by welding, brazing, soldering, etc. The plating may extend about the circumference of the feedthrough where it is to be connected to the frame 34, such as indicated by the dotted line 56 in FIG. 4(a). The feedthrough 30 may also be adhesively bonded to the frame 34 using an epoxy or thermoplastic.

Figure 7:
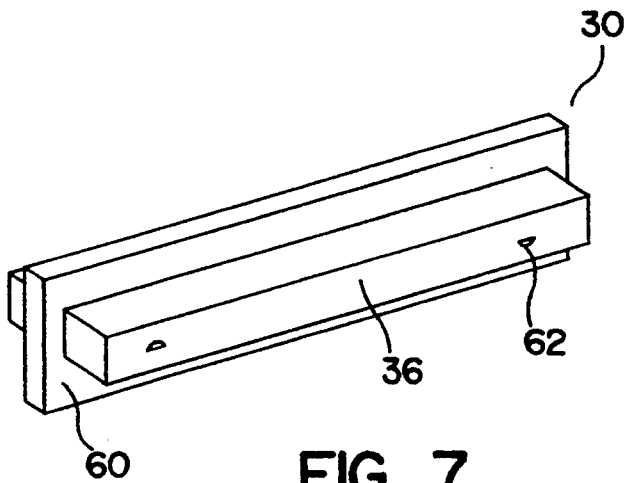
FIG. 7 is a pictorial representation of the embodiment of the feedthrough of the present invention illustrated in FIG. 6.

To relieve the tight tolerance requirements of the fit of the feedthrough 30 into the opening 32, an alternative embodiment of the present invention may be seen in FIGS. 6 and 7. As illustrated therein, an extension 60 may extend about the periphery of the multilayer ceramic structure 36. The extension 60 may be attached to frame 34 when the feedthrough 30 is inserted into the opening 32 to seal the frame 34 more easily than the plating and welding technique discussed above. To form a hermetic seal, the extension 60 may be brazed, welded, soldered or otherwise attached to the frame using conventional techniques at the surface therebetween indicated by the arrow A in FIG. 6. If a hermetic seal is not required, the extension 60 may be attached with epoxy, thermoplastic or an organic material.

If desired, a test pad 62 may be added to one or more connections 38. The test pad 62 should be outside the frame and spaced from the connector pad 44 so it can be contacted. To this end, the test pad 62 may be connected at an extension of the electrically conductive path 40 that reaches the exterior end of plane 52.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A feedthrough for providing a plurality of electrically conductive paths from outside a package for an electronic device to inside the package so that electrical connections may be made with the electronic device, the package having a frame with an opening therethrough for insertion of the feedthrough into a sealed relationship with the frame, the feedthrough comprising:

two ceramic layers joined to form a structure that substantially closes the opening in the frame when inserted thereinto, each of said layers having a CTE compatible with the CTE of the frame so that heat-induced expansion of the frame and said layers does not impair a seal that closes the opening in the frame, said layers joining at a plane that extends through the opening in the frame when said feedthrough is inserted thereinto;

a plurality of electrically conductive paths extending across said plane from outside to inside the frame when said feedthrough is inserted into the opening in the frame; and plural electrically conductive vias extending from an exterior surface of said layers to said plane, each of said plural vias contacting one of said paths adjacent an end thereof, and each of said paths having one of said vias adjacent each end thereof so that an electrical connection may be made from one of said vias outside the frame, through one of said paths and to another of said vias inside the frame when said feedthrough is inserted into the opening in the frame.

2. The feedthrough of claim 1 further comprising metalization on a perimeter of said layers for sealing said layers to the frame when inserted thereinto.

3. The feedthrough of claim 1 further comprising ceramic members extending perpendicularly from opposing exterior surfaces of said feedthrough for attaching said feedthrough to the frame.

4. The feedthrough of claim 1 further comprising electrical contact pads in contact with said vias on the exterior surfaces of said layers.

5. The feedthrough of claim 4 wherein said contact pads comprise a metal selected from the group of metals consisting of copper, nickel, gold and aluminum.

6. The feedthrough of claim 1 wherein said paths comprise a refractory metal paste.

7. The feedthrough of claim 1 wherein said paths comprise one of the metals selected from the group of metals consisting of copper and aluminum.

8. The feedthrough of claim 1 wherein said vias comprise a refractory metal selected from the group of metals consisting of tungsten and molybdenum.

9. The feedthrough of claim 1 further comprising a test pad in electrical contact with one of said paths, said pad being carried on an exterior surface of said layers so that said pad may be contacted and a test signal provided when said feedthrough is inserted in the opening in the frame.

10. The feedthrough of claim 1 wherein said layers comprise a ceramic selected from the group of ceramics consisting of alumina, aluminum nitride, beryllium oxide, and silicon dioxide.

11. The feedthrough of claim 1 comprising at least three said layers.

12. A package for an electronic device comprising:
a frame for carrying the electronic device thereinside, said frame having (a) an opening therethrough for a plurality of electrical connections to the electronic device, and (b) a CTE compatible with the CTE of the portion of the electronic device contacting said frame; and
a feedthrough sealing said opening in said frame for providing a plurality of electrically conductive paths from outside said frame to inside said frame so that electrical connections may be made with the electronic device, said feedthrough comprising (a) a ceramic structure that substantially closes said opening, (b) a CTE compatible with the CTE of said frame so that expansion and contraction of said frame and said feedthrough do not impair the seal therebetween, (c) a plurality of electrically conductive paths interior to said feedthrough and extending from outside to inside said frame, and (d) plural electrically conductive vias, each extending into said feedthrough generally perpendicular to said paths so as to contact one of said paths adjacent an end thereof, each of said paths having one of said vias adjacent each end thereof to form electrical connections from one of said vias outside said frame, through one of said paths and to another of said vias inside said frame.

13. The package of claim 12 wherein said electrical connections in said feedthrough are U-shaped in vertical cross-section.

14. The package of claim 12 wherein said electrical connections in said feedthrough are L-shaped in vertical cross-section.

15. The package of claim 12 wherein said frame comprises a material selected from the group of materials consisting of metal matrix composite, Kovar, molybdenum, and explosively bonded metals.

16. The package of claim 15 wherein said ceramic structure comprises a ceramic selected from the group of ceramics consisting of alumina, aluminum nitride, beryllium oxide, and silicon dioxide.

17. The package of claim 12 wherein said feedthrough is hermetically sealed into said opening.

18. A feedthrough for a package for an electronic device, the feedthrough comprising:
a ceramic body that is adapted to fit into an opening in the package;
a plurality of electrically conductive paths interior to said ceramic body throughout their lengths, said paths comprising a non-self supporting metallic coating; and
a plurality of electrically conductive vias connecting said paths to an exterior surface of said ceramic body.

19. The feedthrough of claim 1 wherein a distance between centers of adjacent ones of said paths is between 0.050 inches and 0.020 inches.

20. The package of claim 12 wherein the CTE of said feedthrough is within 20 percent of the CTE of said frame over the normal operating ranges of the electronic device.

21. A feedthrough for a package for an electronic device, the feedthrough comprising:
a ceramic body that is adapted to fit into an opening in the package;
a plurality of electrically conductive paths interior to said ceramic body throughout their lengths; and
a plurality of electrically conductive vias extending from an exterior surface of said ceramic body to said paths for connecting said paths to an exterior surface of said ceramic body, said exterior surface and said paths not being coplanar.

22. The feedthrough of claim 21 wherein said paths are in a plane that is generally parallel to said exterior surface.

23. The feedthrough of claim 21 wherein said vias are generally perpendicular to said exterior surface.

24. The feedthrough of claim 18 wherein said exterior surface and said paths are not coplanar.

25. The feedthrough of claim 18 wherein said paths are in a plane that is generally parallel to said exterior surface.

26. The feedthrough of claim 18 wherein said vias are generally perpendicular to said exterior surface.

* * * * *